United States Patent [19]

Campioni

[11] 4,078,213

[45] Mar. 7, 1978

[54] TRANSMITTER SELECTION CIRCUIT FOR A RADIO OR TELEVISION RECEIVER

[75] Inventor: Armando Campioni, Turin, Italy

[73] Assignee: Indesit Industria Elettrodomestici Italiana S.p.A., Turin, Italy

[21] Appl. No.: 701,269

[22] Filed: Jun. 30, 1976

[30] Foreign Application Priority Data

Jul. 11, 1975 Italy .................................. 68805/75

[51] Int. Cl.² ............................................. H04B 1/16
[52] U.S. Cl. .................................... 325/459; 325/464; 331/1 A; 331/18; 331/25; 358/191
[58] Field of Search .................... 325/17, 25, 419–423, 325/334, 335, 453, 458, 459, 464, 468; 334/15; 358/191, 195; 331/1 A, 18, 20, 25

[56] References Cited

U.S. PATENT DOCUMENTS 3,980,951   9/1976   Breeze et al. ........................ 325/464

OTHER PUBLICATIONS

"A Frequency Synthesizer for Television Receivers" – Eric Breeze, Aug. 1974 – Fairchild Journal of Semiconductor Progress, vol. 2, #8 pp. 3–8.
"Television Simplified" – 5th Edition – Milton S. Kiver – 1955, pp. 494–495.
"A Uniquely Simplified TV Tuning System Incorporating An Equally Unique Digital Automatic and Manual Fine Tuning Scheme" –Steve Hilliker, Motorola Semiconductor Products, Inc., Feb. 1976, pp. 61–68.

Primary Examiner—Benedict V. Safourek
Assistant Examiner—Marc E. Bookbinder
Attorney, Agent, or Firm—Sughrue, Rothwell, Mion, Zinn and Macpeak

[57] ABSTRACT

A receiver for radio or television signals having a channel selection device for controlling the frequency of a local oscillator whereby to adjust this to mix with signals on different selected frequencies to produce an intermediate frequency signal for demodulation, in which the local oscillator is controlled by a variable impedance device the impedance of which is varied by an error signal produced by comparing a reference signal with a signal divided down from the output of the local oscillator. The dividers are programmable dividers which operate with different division factors in dependence on a control signal from a keyboard or other control device. The reference oscillator is an oscillator used for other purposes in the receiver, and the local oscillator frequencies are multiples of 0.5 MHz, the intermediate frequency being 38.75 MHz.

3 Claims, 1 Drawing Figure

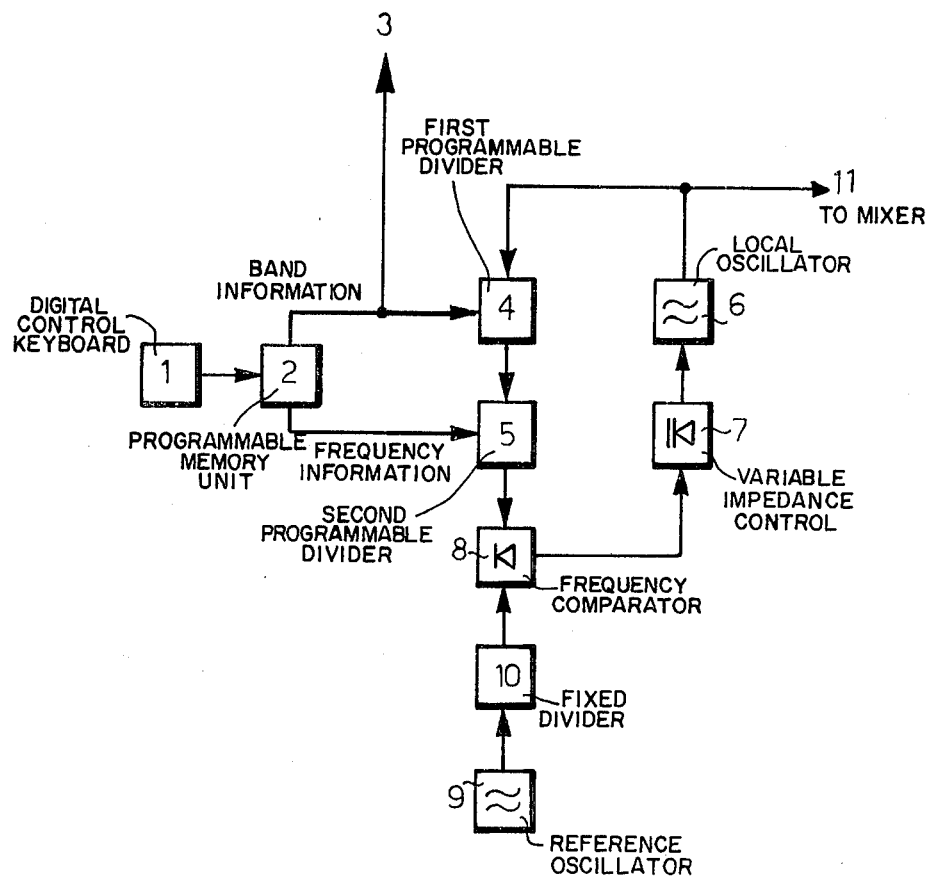

TRANSMITTER SELECTION CIRCUIT FOR A RADIO OR TELEVISION RECEIVER

The present invention relates generally to a radio or television receiver having a channel selection circuit, that is a circuit for "tuning" the receiver to a particular carrier frequency for selecting a transmission station, of the type in which the frequency of a local oscillator is adjusted to select the channel received. Particularly, the present invention relates to a television receiver, and especially to a receiver having a channel selection circuit of the type comprising a control device operable to produce control signals the values of which depend on the channel to be selected, at least one programmable frequency divider which is programmed to divide by predetermined division factors selected by different control signals from the control device, the frequency divider being connected to the output of the local oscillator and operating to provide an output signal which is divided down from the oscillator frequency to a value dependent on the selected division factor of the divider, a frequency comparator operating to compare the output signal from the divider with a reference signal from a reference oscillator to produce an error signal which is fed to a variable impedance device which controls the frequency of the local oscillator.

The present invention seeks to provide a circuit of the general type described above, but which is simpler than known circuits of this type and in particular, is suitable for use in Italy, where the frequency subdivision of the television channels differs from that adopted by other countries.

According to one aspect of the present invention, there is provided a radio or television receiver having a channel selection circuit comprising a control device operable to produce control signals the values of which depend on the channel to be selected, at least one programmable frequency divider which is programmed to divide by predetermined division factors selected by different control signals from the control device, the frequency divider being connected to the output of the local oscillator and operating to provide an output signal which is divided down from the oscillator frequency to a value dependent on the selected division factor of the divider, a frequency comparator operating to compare the output signal from the divider with a reference signal from a reference oscillator to produce an error signal which is fed to a variable impedance device which controls the frequency of the local oscillator, characterised in that the reference frequency oscillator is an oscillator also used in the radio or television circuit for other purposes.

Advantageously television or radio receivers constructed as embodiments of the invention can be made so that the intermediate frequency is such that the frequency values which the local oscillator must assume for the reception of the various transmitters are whole multiples of 0.5 MHz.

According to another aspect of the invention, there is provided a radio or television receiver having a channel selection circuit comprising a control device operable to produce control signals the values of which depend on the channel to be selected, at least one programmable frequency divider which is programmed to divide by predetermined division factors selected by different control signals from the control device, the frequency divider being connected to the output of the local oscillator and operating to provide an output signal which is divided down from the oscillator frequency to a value dependent on the selected division factor of the divider, a frequency comparator operating to compare the output signal from the divider with a reference signal from a reference oscillator to produce an error signal which is fed to a variable impedance device which controls the frequency of the local oscillator, characterised by the fact that the programmable frequency divider comprises first and second frequency divider circuits arranged in cascade with one another.

One embodiment of the invention will now be more particularly described, by way of example, with reference to the accompanying drawing which is a block schematic diagram of a circuit for selecting a television channel, suitable for use in a television receiver.

Referring now to the drawing the block 1 represents a digital control keyboard, provided with keys numbered from 0 to 9, by means of which it is possible to select the number of the television channel it is desired to receive, for example, channel 21.

In dependence on the selected channel number the keyboard transmits suitable signals in code to a programmable memory unit indicated by the box 2. The memory unit 2 transmits two information signals following reception of a coded number: a first information signal which defines in code the band (VHF or UHF) in which the selected channel is situated (for example, the band IV UHF in the case of the channel 21), this first information signal is passed along a connection 3, to another part of the television circuit, which does not form part of the present invention, and thus is not described herein; it also reaches a first programmable divider circuit 4; and a second information signal which defines, below a certain factor, the frequency to be assumed by the local oscillator of the television set in order to receive the selected channel (for example, in the given instance, this second signal represents the number 255, which is, as will be explained below, related to the frequency which the local oscillator must generate in order to receive the channel 21); this second information signal is fed to a second programmable divider 5.

The two dividers 4 and 5 are inserted in cascade between the oscillator 6, controlled by a variable impedance device 7 (for example, a varicap diode), and a frequency comparator 8. The comparator 8 also receives a reference signal produced by a reference oscillator 9, which is fed to the comparator 8 through a fixed divider 10.

The signal from the local oscillator 6 is fed along a conductor 11 to a mixer (not shown in the drawing) used for demodulating the received signal. The reference oscillator 9 is an oscillator already existing in the television set, for example it may be the line oscillator. In this case, the divider 10 would be unnecessary because it would be required to divide only by 1.

In order to understand the operation of the circuit described, some preliminary information on television channels is needed.

The distribution of the frequency of television channels is different in different countries. For example, in West Germany, the frequencies of the video carriers, less 0.25, all have values represented, in MHz, by whole numbers and are 7 MHz apart from each other in the VHF waveband and 8 MHz apart in the UHF waveband. On the other hand, in Italy, there are some channels in which the frequency of the video carrier, less 0.25, is not a whole number of MHz. (for example, the channel A for which the carrier frequency $f_{PV} = 53.75$); moreover, the spacing between the channels is not constant. The frequency which the local oscillator must generate is given by the sum of the frequency of the video carrier of the selected channel and the intermediate frequency to which the receiver is adjusted. Usually, in Western Europe, the intermediate frequency used is 38.9 MHz. In receivers constructed as embodiments of the invention, however, it is preferred that this frequency is instead selected to be equal to 38.75 MHz, so that the required local oscillator frequencies, for the German channels, are whole numbers of MHz. (for example, in channel 21 the video carrier frequency $f_{PV}$ is 471.25 MHz, so the required local oscillator frequency $f_o = 471.25 + 38.75 = 510$ MHz). With Italian channels the required local oscillator frequencies are also whole numbers of MHz, except in two cases, channel A and channel E, in which the required local oscillator frequencies are multiples of 0.5 MHz. (for example, Channel A: $f_{PV} = 53.75$; $f_o = 53.75 + 38.75 = 92.5$ MHz).

The oscillator 9 is an oscillator already present in the receiver circuit; as mentioned above, one suitable oscillator which could be used in the line oscillator which operates at 15.625 KHz (in which case the divider 10 is not required). Thus, when the channel A (band T, VHF) is selected, the divider 4 is programmed to divide by 32 and the divider 5 is programmed to divide by 185 (that is to say, $2 f_o$).

The frequency of the local oscillator 6 will be controlled by the effect of the comparator 8, to operate at a frequency $15625 \times 185 \times 32 = 92.5 \times 10^6$, which is the frequency required.

If, for example, channel 21 (band IV UHF) is selected, the divider 4 must be programmed to divide by 128 and the divider 5 programmed to divide by 255 (fo/2). In this case the frequency of the oscillator 6 will be $15625 \times 255 \times 128 = 510 \times 10^6$, which is the frequency required.

In other words, the divider 4 is programmed to divide by 32 when selecting a channel in the VHF waveband and by 128 when selecting a channel in the UHF waveband. This divider can be a known type of seven stage programmable divider. The divider 5 is programmed to divide by a different number for each channel, the number being twice the required local oscillator frequency when selecting a channel in the VHF waveband and half the local oscillator frequency when selecting a channel in the UHF waveband. The minimum value of the division factor by which the divider 5 divides in the VHF waveband is for channel E (174) and the maximum value of the division factor by which the divider 5 divides is for channel $E_{12}$ (526).

In the UHF waveband the minimum division factor to which the divider 5 must be programmed is 255 for channel 21, and the maximum value of the division factor is 495 for channel 81. Thus the range of division factors over which the divider 5 must be programmed lies between 174 and 526.

The reference oscillator 9 may be an oscillator other than the line oscillator mentioned above; for example it may be a 0.5 MHz oscillator of sufficient stability, in which case, the divider 4 would be programmed to divide by 4 in the UHF waveband and by 1 in the VHF waveband. Alternatively the reference oscillator 9 may be the 4.43 MHz. oscillator used in European colour television sets; in this case, the dividers are programmed as follows: divider 10 divides by 1135; divider 4 divides by 128 in the VHF waveband and by 512 in the UHF waveband: the comparison frequency is one quarter of the line frequency; there is a slight lack of accuracy due to the raster off-set incorporated in the 4.43 frequency ($4433618.75 = 1135/4 f_H + 25$) but since the error is only 25 Hz in 4 MHz (and therefore in the worst case, 6.25 kHz in 1 GHZ) this is quite negligible. In countries where the 50 HZ NTSC system is used, the situation is more favourable since the frequency of the colour subcarrier is equal to $455/2 f_H$. It is thus sufficient to programme the divider 10 to divide by 455 and the divider 4 to divide by 64 in the VHF waveband and by 256 in the UHF waveband.

Alternatively the reference oscillator 9 may be an oscillator of sufficient stability generating 31.250 KHz, for example using a quartz oscillator, which may be of a known type, from which to obtain the line frequency and the reference frequency for the comparator 8. In a further modification of the system (not shown) there are provided two keys which, upon depression, cause the programmable divider 5 to increase or decrease its division factor by one unit respectively. The two keys would be suitably marked, for example +1 and −1, and in the example given regarding channel A, by pressing the key +1 the division factor would increase from 185 to 186 thus changing by 0.5 MHz the frequency of the local oscillator.

This arrangement makes it possible to achieve a better practical tuning in cases when the tuning according to the theoretical considerations given above does not give optimum results, for example because of propagation conditions or the characteristics of the receiver.

What is claimed is:

1. A radio or television receiver having a channel selection circuit for selecting a channel among a plurality of channels belonging to first and second different wavebands, said circuit comprising:
   a control device operable to produce control signals the values of which depend on the channel to be selected,
   at least one programmable frequency divider which is programmed with a plurality of predetermined division factors and which comprises first and second programmable frequency divider circuits connected in cascade with one another, said programmable frequency divider being programmed with two different division factors selected in dependence on whether the selected channel is in the first waveband or in the second waveband,
   different control signals from said control device, controlling said programmable frequency divider to divide by a selected one of said plurality of predetermined division factors,
   a local oscillator,
   means connecting said frequency divider to the output of said local oscillator, whereby said frequency divider provides an output signal which is divided down from the oscillator frequency to a value dependent on the division factor of said divider determined by the control signal from said control device,
   a frequency comparator,
   means connecting the output signal from said divider to said frequency comparator,
   a reference oscillator producing a reference signal,
   means connecting said reference oscillator to said frequency comparator, and a variable impedance device connected between the output of said frequency comparator and a control input of said local oscillator, whereby to control the frequency of said local oscillator.

2. A receiver as in claim 1, wherein said second programmable frequency divider is programmed with a different division factor for each selectable channel.

3. A receiver as in claim 1 wherein the two division factors of said first frequency divider circuit are in the ratio of four to one.

* * * * *